(12) United States Patent
Brand et al.

(10) Patent No.: US 8,408,222 B2
(45) Date of Patent: Apr. 2, 2013

(54) DEVICE FOR COATING THE OUTER EDGE OF A SUBSTRATE DURING MICROELECTRONICS MANUFACTURING

(75) Inventors: Gary J. Brand, St. James, MO (US); Philip H. Allen, Rolla, MO (US); Ramachandran K. Trichur, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 157 days.

(21) Appl. No.: 12/505,978

(22) Filed: Jul. 20, 2009

(65) Prior Publication Data

US 2010/0012024 A1    Jan. 21, 2010

Related U.S. Application Data

(62) Division of application No. 11/268,196, filed on Nov. 7, 2005, now Pat. No. 7,579,044.

(60) Provisional application No. 60/626,034, filed on Nov. 8, 2004.

(51) Int. Cl.
*B05C 11/10* (2006.01)

(52) U.S. Cl. ........... 134/182; 118/52; 118/501; 118/506

(58) Field of Classification Search .................. 134/182
See application file for complete search history.

(56) References Cited

U.S. PATENT DOCUMENTS

| | | | |
|---|---|---|---|
| 4,967,782 A | 11/1990 | Yamashita et al. | |
| 4,982,694 A | 1/1991 | Moriyama | |
| 5,312,487 A | 5/1994 | Akimoto et al. | |
| 5,672,205 A | 9/1997 | Fujimoto et al. | |
| 5,762,709 A | 6/1998 | Sugimoto et al. | |
| 5,908,661 A * | 6/1999 | Batcheldor et al. | 118/52 |
| 5,975,016 A * | 11/1999 | Wesenhagen | 119/61.55 |
| 6,033,480 A | 3/2000 | Chen et al. | |
| 6,168,660 B1 * | 1/2001 | Hayes et al. | 118/52 |
| 6,192,903 B1 | 2/2001 | Doi et al. | |
| 6,415,804 B1 * | 7/2002 | Pascal et al. | 134/182 |
| 6,663,474 B2 | 12/2003 | Chen | |
| 6,673,151 B2 | 1/2004 | Yoshihara et al. | |
| 6,676,757 B2 | 1/2004 | Kitano et al. | |

(Continued)

FOREIGN PATENT DOCUMENTS

| EP | 0 976 460 | 2/2000 |
|---|---|---|
| EP | 1 296 358 | 3/2003 |

(Continued)

OTHER PUBLICATIONS

Office action dated Jan. 24, 2008 in corresponding U.S. Appl. No. 11/268,196, filed Nov. 7, 2005.

(Continued)

*Primary Examiner* — Dah-Wei Yuan
*Assistant Examiner* — Stephen Kitt
(74) *Attorney, Agent, or Firm* — Hovey Williams LLP

(57) ABSTRACT

New baffles and methods of using these baffles are provided. The baffles comprise a body having an edge wall configured to direct the flow of a composition against a substrate (e.g., silicon wafer) edge. The edge wall comprises a vertical surface, a curved sidewall coupled to the vertical surface, and a lip coupled to the curved sidewall. A preferred baffle is annular in shape and formed from a synthetic resinous composition. Even more preferably, the baffle is not formed of a metal. The inventive methods comprise positioning the baffle adjacent a substrate during a spin coating process so that the edge wall causes the composition to cover the edges of the substrate and preferably a portion of the back side of the substrate.

24 Claims, 12 Drawing Sheets

U.S. PATENT DOCUMENTS

| | | |
|---|---|---|
| 6,713,236 B2 | 3/2004 | Chen |
| 6,717,240 B2 | 4/2004 | Higashi |
| 6,733,829 B2 | 5/2004 | Stacey et al. |
| 6,780,245 B2 | 8/2004 | Horie et al. |
| 6,939,783 B2 | 9/2005 | Neyret et al. |
| 7,579,044 B2 | 8/2009 | Brand et al. |
| 2004/0083976 A1 | 5/2004 | Meyyappan |
| 2005/0139160 A1 | 6/2005 | Lei et al. |

FOREIGN PATENT DOCUMENTS

| | | |
|---|---|---|
| JP | 63 076431 | 4/1988 |
| JP | 11-238667 | 8/1999 |

OTHER PUBLICATIONS

Office action dated Jun. 16, 2008 in corresponding U.S. Appl. No. 11/268,196, filed Nov. 7, 2005.
Office action dated Apr. 16, 2009 in corresponding U.S. Appl. No. 11/268,196, filed Nov. 7, 2005.
International Search Report and Written Opinion dated Jul. 14, 2006 in corresponding PCT/US05/40433 filed on Nov. 7, 2005.
International Preliminary Report on Patentablilty dated Apr. 6, 2007 in corresponding PCT/US05/40433 filed on Nov. 7, 2005.

* cited by examiner

DEVICE FOR COATING THE OUTER EDGE OF A SUBSTRATE DURING MICROELECTRONICS MANUFACTURING

RELATED APPLICATIONS

This application is a divisional application of U.S. patent application Ser. No. 11/268,196, filed Nov. 7, 2005, now U.S. Pat. No. 7,579,044, which claims the priority benefit of U.S. Provisional Patent Application No. 60/626,034, filed Nov. 8, 2004, both of which are incorporated by reference herein.

BACKGROUND OF THE INVENTION

1. Field of the Invention

The present invention is broadly concerned with a baffle useful for directing a coating composition towards and over the edges of a substrate during microelectronic fabrication.

2. Description of the Prior Art

Microelectronic devices such as integrated circuits and microelectromechanical (MEMs) devices are typically formed by applying layers of coatings onto a substrate and forming those layers into the shapes and sizes needed for the particular device design. These layers are typically formed by spin coating a liquid composition onto the substrate, however, the coating does not typically flow to and over the edges of the substrate, thus leaving them unprotected. The substrates are subsequently subjected to etching and polishing processes. These are relatively harsh processes. As a result, the coatings often experience lift-off problems at their edges, i.e., the edges of the coatings pull away from the substrate. This leaves the substrate unprotected at its edges and vulnerable to subsequent processing conditions. The substrate will often become thinner and susceptible to cracking and breaking. This results in a reduction in wafer yield, thus increasing cost.

SUMMARY OF THE INVENTION

The present invention overcomes these problems by broadly providing a novel baffle for affecting the flow of a composition during application of the composition to a substrate and directing that flow to and over the edge, and possibly back side, of the substrate.

In more detail, the baffle preferably comprises a body that is annular in configuration and includes an inner edge wall defining an opening and configured to direct the flow of the composition to the substrate edge. The edge wall comprises a vertical surface, a curved sidewall coupled with the vertical surface, and a lip coupled with the curved sidewall.

In use, the baffle and substrate are positioned so that the substrate edges are adjacent to, but preferably not in contact with, the baffle edge wall. The composition is then applied to the substrate via a typical spin coat process, with the centrifugal forces causing the composition to flow to the outer periphery of the substrate, and thus towards the baffle. The baffle edge wall causes the composition to cover the edges of the substrate. The wafer can then be subjected to further processing (e.g., baking/curing, etching, further layer application, etc).

BRIEF DESCRIPTION OF THE DRAWING FIGURES

FIG. 6a is an SEM showing the edge of a silicon wafer after being coated with a protective material according to a prior art process;

FIG. 6b is an enlarged view of the edge of FIG. 6a;

DETAILED DESCRIPTION OF THE PREFERRED EMBODIMENTS

Figure 1:
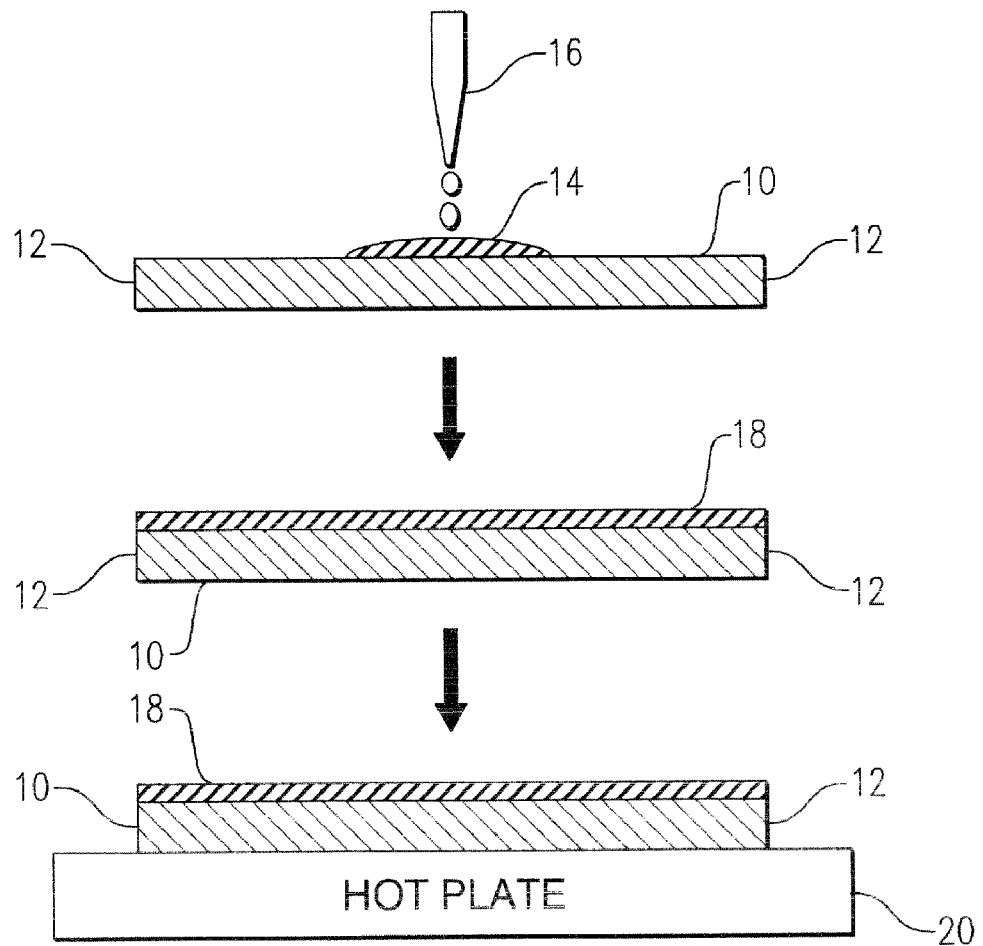
FIG. 1 is a schematic drawing depicting the problems associated with the prior art processes.

FIG. 1 illustrates a process according to the prior art. A substrate 10 having edge 12 is provided. A protective material 14 is applied to the substrate 11 via dispense nozzle 16 and formed into a film 18 via a spin coating process. The substrate 10 is then heated on a hot plate 20 and subjected to further processing. As shown in FIG. 1, the film 18 does not cover edge 12, thus leaving it unprotected during subsequent processing steps such as wet etching.

Figure 2:
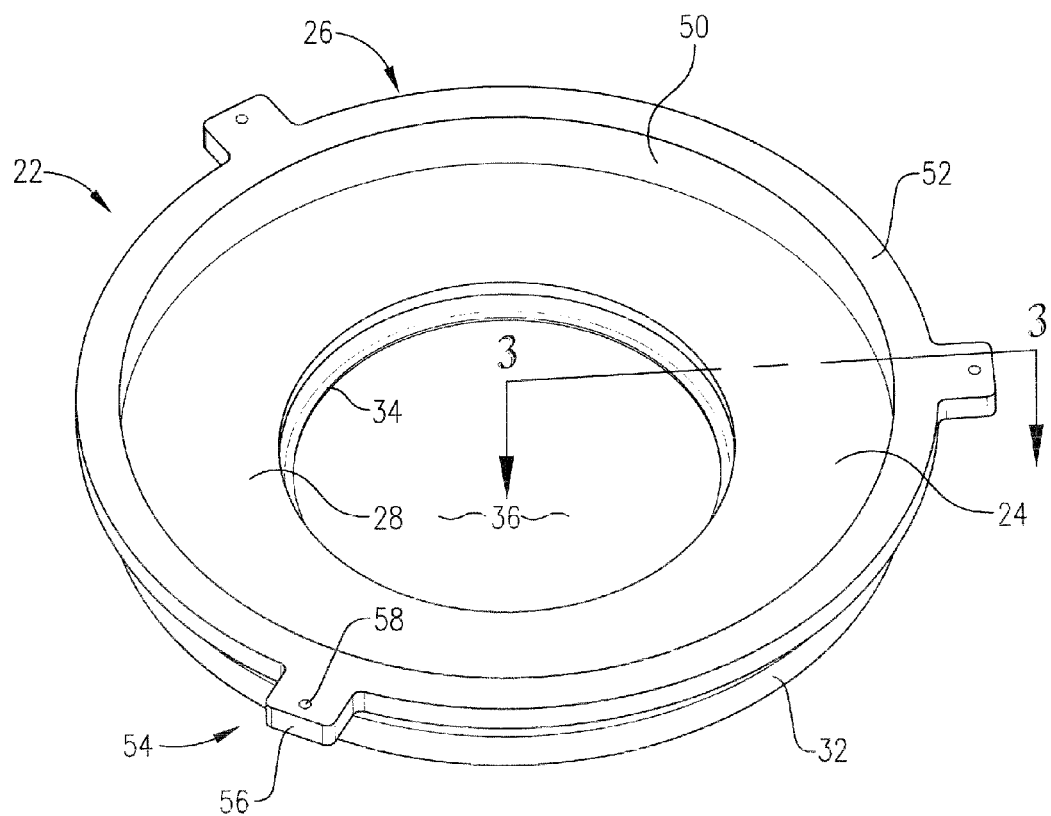
FIG. 2 is a perspective view of a baffle according to the present invention.
Figure 3:
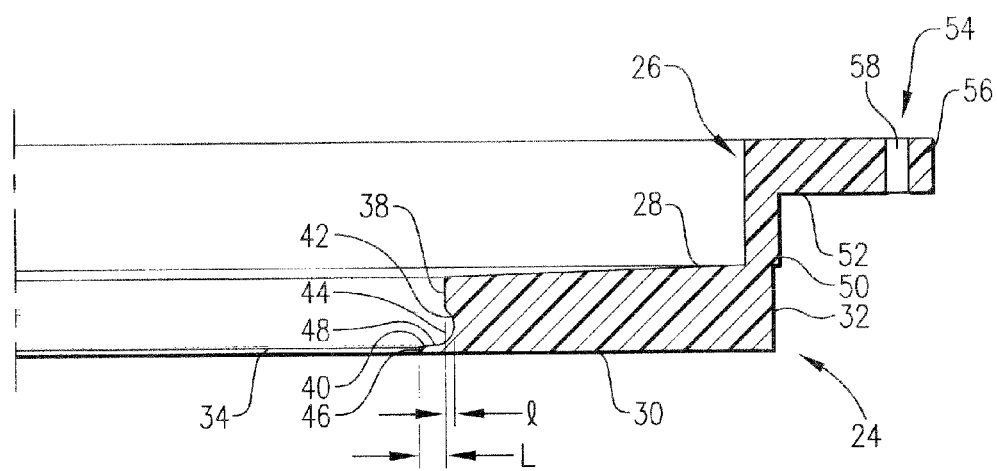
FIG. 3 is a sectional view taken along line 3-3 of the baffle of FIG. 2.

The baffle according to the present invention overcomes this problem with its novel design. Referring to FIGS. 2 and 3, a baffle 22 is provided. Baffle 22 comprises an annular base 24 and support member 26. Annular base 24 includes upper and lower surfaces 28, 30 and circumferential outer and inner edges 32, 34, respectively. Upper surface 28 slopes slightly towards surface 30 as it approaches edge 34.

Inner edge or edge wall 34 defines an opening 36. Edge 34 includes vertical surface 38 and a lower lip 40. Vertical surface 38 and outer edge 32 are substantially parallel to one another. Vertical surface 38 and lip 40 are joined via a bight or curved sidewall 42. It will be appreciated that lower lip 40 extends beyond vertical surface 38, however, this distance should be limited to allow the composition to collect within curved sidewall 42, but still allow the composition to drain past the lower lip 40. Thus, the length of "L" should be from about 1.5-4 times, and more preferably from about 2-3 times. The length of "l," e where "l" is the shortest distance from the innermost point (i.e., apex) in curved sidewall 42 to a line 44 that extends vertically from vertical surface 38 towards lower surface 30, and "L" is the distance from line 44 to the end 46 of lower lip 40, as shown in FIG. 3.

Lip 40 comprises an upper lip surface 48 that preferably slopes in a downward direction towards lower surface 30. The angle of slope of upper lip surface 48 is preferably from about 1-15°, and even more preferably from about 2-10°, with a perfectly horizontal line being a slope of 0.

Support member 26 of baffle 22 comprises an upright member 50 and a flange 52, with flange 52 preferably being substantially perpendicular to upright member 50. In a preferred embodiment, flange 52 will comprise at least 2, and preferably at least 3, leveling devices 54. Preferred devices 54 comprise protrusions 56 extending therefrom, with each of these protrusions 56 comprising an opening 58 configured to receive an adjustable fastener such as a set screw (not shown) that can be used to adjust the baffle 22 as necessary. It will be appreciated that the above specifications allow the baffle to be sized for the particular process conditions (e.g., substrate size, equipment being used, etc.), making the inventive baffle quite versatile.

Baffle 22 can be formed of a number of different materials, depending upon the equipment, process conditions, etc. to which it will be exposed. However, it is preferred that the baffle 22 be formed of a synthetic resin composition that is resistant to (i.e., will not react with or be eroded by) solvents that are typically utilized during microelectronic manufacturing. Such solvents include those selected from the group consisting of propylene glycol monomethyl ether acetate, propylene glycol monomethyl ether, ethyl lactate, methyl isoamyl ketone, n-methyl-2-pyrrolidone, and isopropyl alcohol.

It is also preferred that the baffle 22 be formed of a non-metallic material. That is, the material forming baffle 22 would comprise less than about 5% by weight, preferably less than about 1% by weight, and more preferably 0% by weight metal, based upon the total weight of the baffle taken as 100% by weight.

Particularly preferred materials of which baffle 22 can be formed include those selected from the group consisting of polytetrafluoroethylene (TEFLON®), polyethylene (preferably high density), polypropylene, polyphenylene sulfide, acetals, polyether ether ketone (available under the name PEEK from Tangram Technology Ltd.), and mixture of the foregoing.

Figure 4:
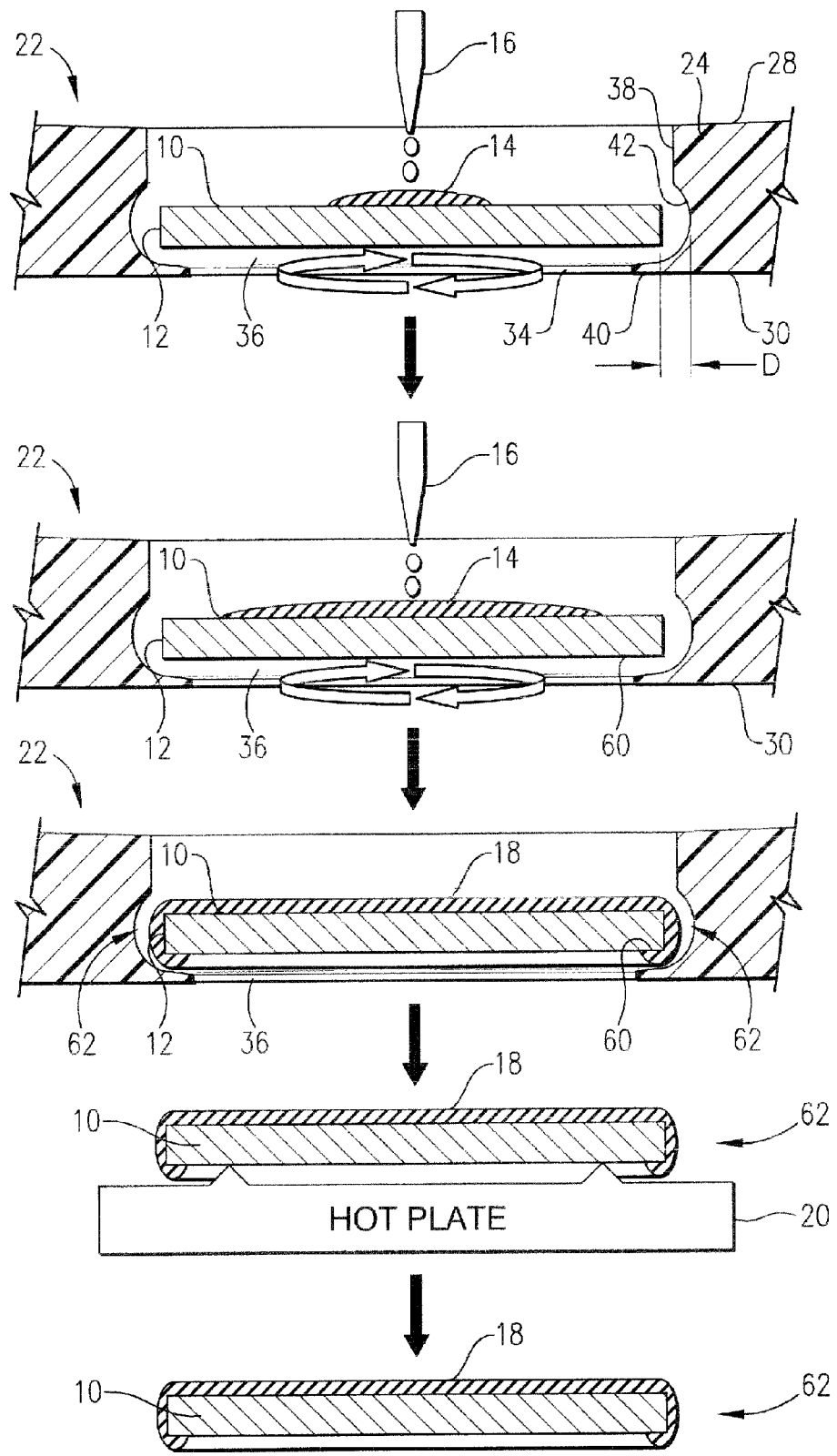
FIG. 4 is a schematic drawing illustrating a coating process utilizing the inventive baffle.

FIG. 4 illustrates the use of the inventive baffle 22. First, the substrate 10 is positioned on a chuck (not shown) within a spin coating apparatus. Examples of typical substrates 10 include those selected from the group consisting of silicon, silicon dioxide, silicon nitride, aluminum gallium arsenide, aluminum indium gallium phosphide, gallium nitride, gallium arsenide, indium gallium phosphide, indium gallium nitride, indium gallium arsenide, aluminum oxide (sapphire), glass, quartz, polycarbonates, polyesters, acrylics, polyurethanes, papers, ceramics, and metals (e.g., copper, aluminum, gold).

The inventive baffle 22 is then placed in the apparatus so that flange 52 rests upon a surface of the apparatus (not shown) and so that the edge 12 of the substrate 10 is approximately centered adjacent curved sidewall 42 within opening 36. The baffle 22 is adjusted as necessary via the height-adjusting devices 54 (not shown in FIG. 4) so that the baffle 22 is level, and the substrate 10 is centered properly. It is preferred that the baffle is sized so that the distance "D" from the innermost point or apex in curved sidewall 42 to the substrate edge 12 is a distance of from about 0.85-4 mm, and more preferably from about 0.85-2 mm. Thus, the substrate and baffle are preferably not in contact with one another.

After the baffle 22 and substrate 10 are properly positioned, the substrate is rotated while dispensing material 14 via dispense nozzle 16. Unlike the prior art processes, however, the material 14 will accumulate in the baffle 22 in the recess created by curved sidewall 42, and the material 14 will be directed towards the substrate edge 12 and even to the back surface 60 as shown in area 62. Thus, the substrate edge 12 and at least part of the back surface 60 will be covered with the protective film 18, protecting the substrate 10 from etching, thinning, and other damage during subsequent processing steps. More particularly, when using the inventive baffle, at least about 90%, preferably at least about 95%, and even more preferably about 100% of the surface area of the substrate edge 12 will be covered by the composition being applied to the substrate.

EXAMPLES

The following examples set forth preferred methods in accordance with the invention. It is to be understood, however, that these examples are provided by way of illustration and nothing therein should be taken as a limitation upon the overall scope of the invention.

Example 1

Comparative Example

A prior art process was carried out without using the inventive baffle in order to illustrate the drawbacks of that process.

Figure 5:
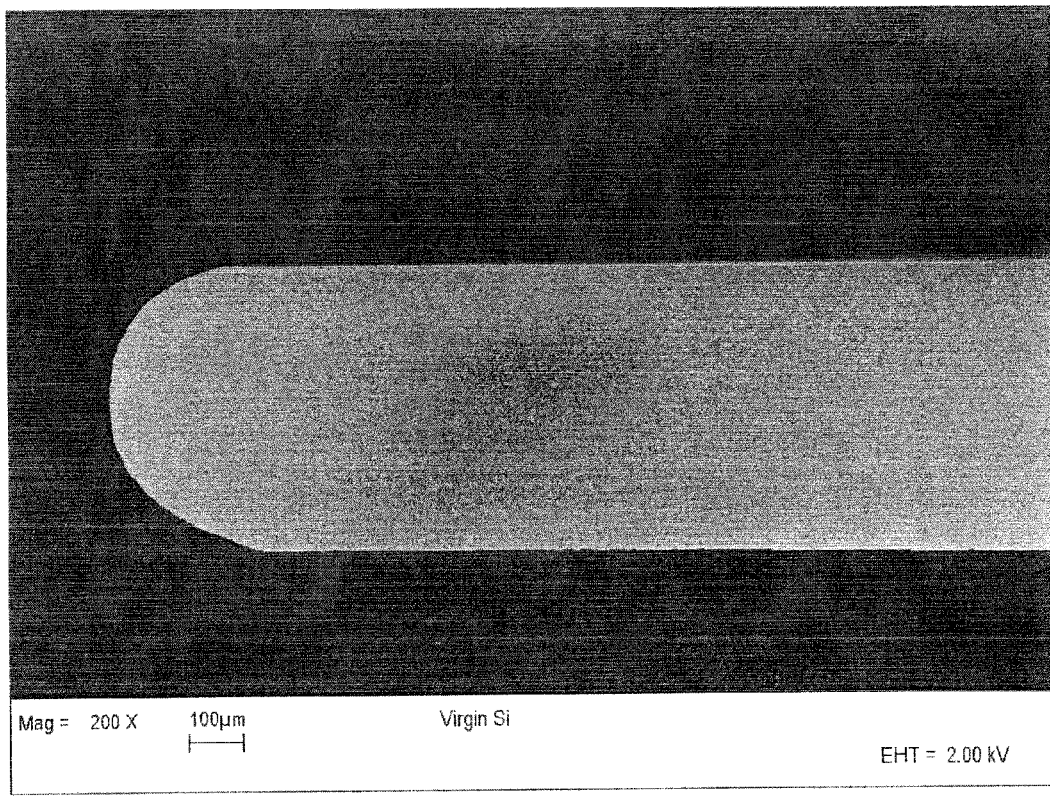
FIG. 5 is a Scanning Electron Microscope (SEM) photograph depicting the edge view of a virgin silicon wafer.
Figures 6A, 6B:
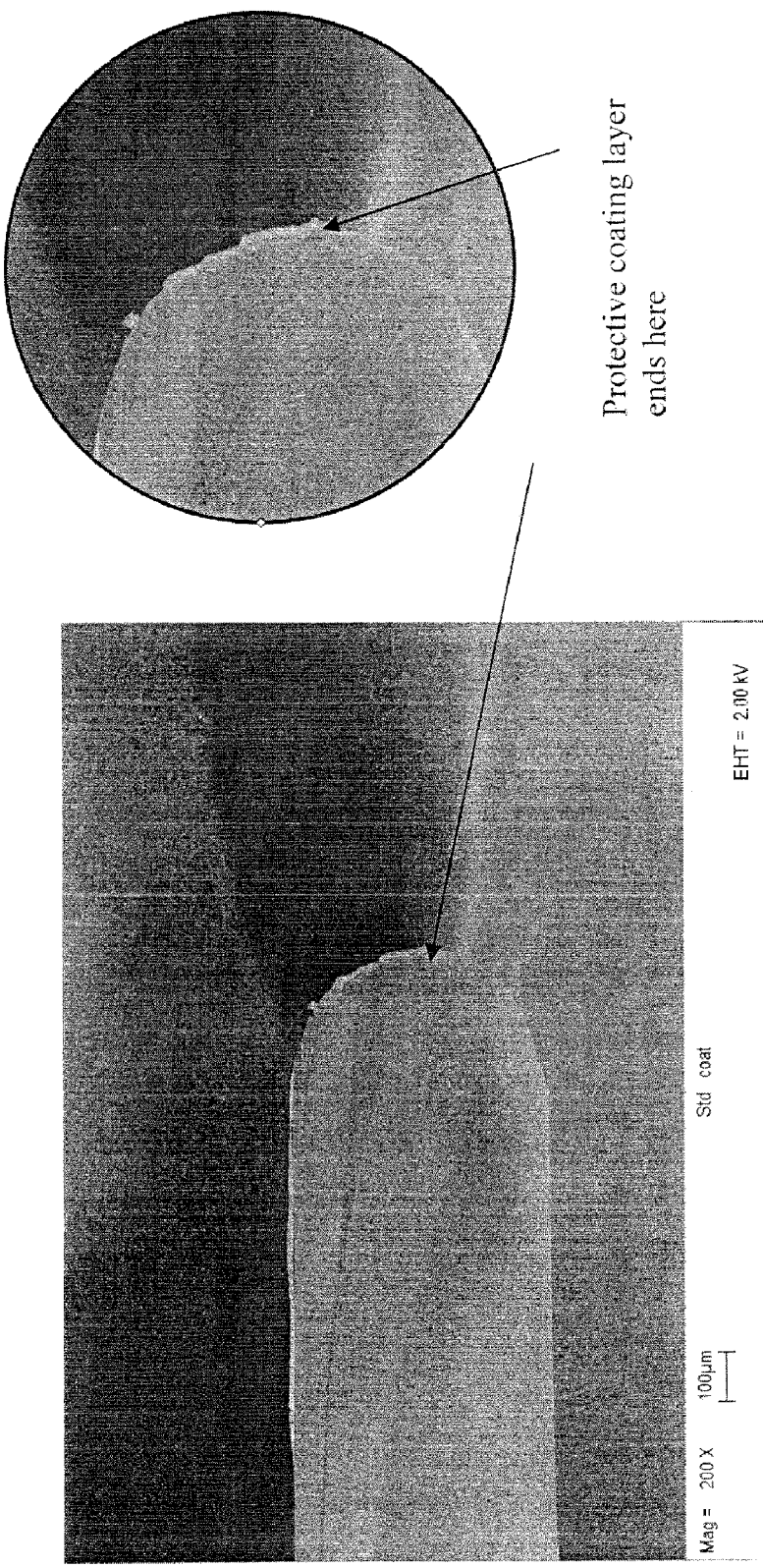
Figure 7:
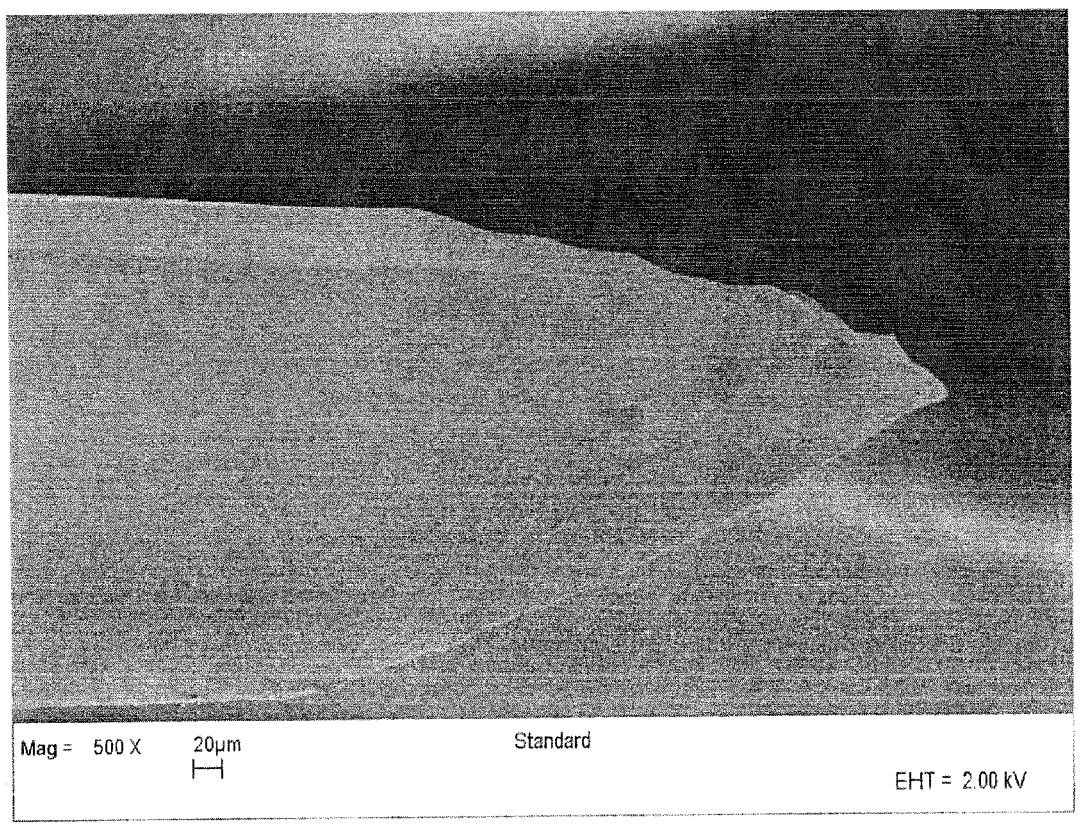
FIG. 7 is an SEM depicting the "knife-edge" obtained after the wafer of FIG. 6a was subjecting to a wet etching process.

Virgin silicon wafers have smooth, rounded edges. FIG. 5 is an SEM photograph depicting such an edge. An etch protective film comprising ProTEK primer and ProTEK B (available from Brewer Science Inc.) was spin coated onto a virgin silicon wafer using a standard spin coating process. FIG. 6a shows the etch protective film on the wafer. As shown in FIG. 6b, the edge was not completely covered. The silicon wafer was then subjected to a wet etch process using potassium hydroxide. As shown in FIG. 7, the etch process resulted in a "knife-edge" at the edge of the wafer. The etching process resulted in lifting of the film, thereby providing poor protection to the wafer edge. Such a thin wafer edge presents significant handling problems as it generally leads to the development of cracks on the wafer, leading to breakage and a reduction in yield. This problem is even more pronounced in thin-wafer handling.

Example 2

Use of Inventive Baffle

The process described in Example 1 was repeated except that a baffle according to the invention, sized according to the wafer size, was used. During spinning, the baffle collected the excess etch protective material and coated it on the edge and back of the wafer. As a result, the etch protective material applied to the top, edge, and under-side rim of the wafer, thus encapsulating the wafer and its edges and preventing lifting of the film at the wafer edge.

Figures 8A, 8B:
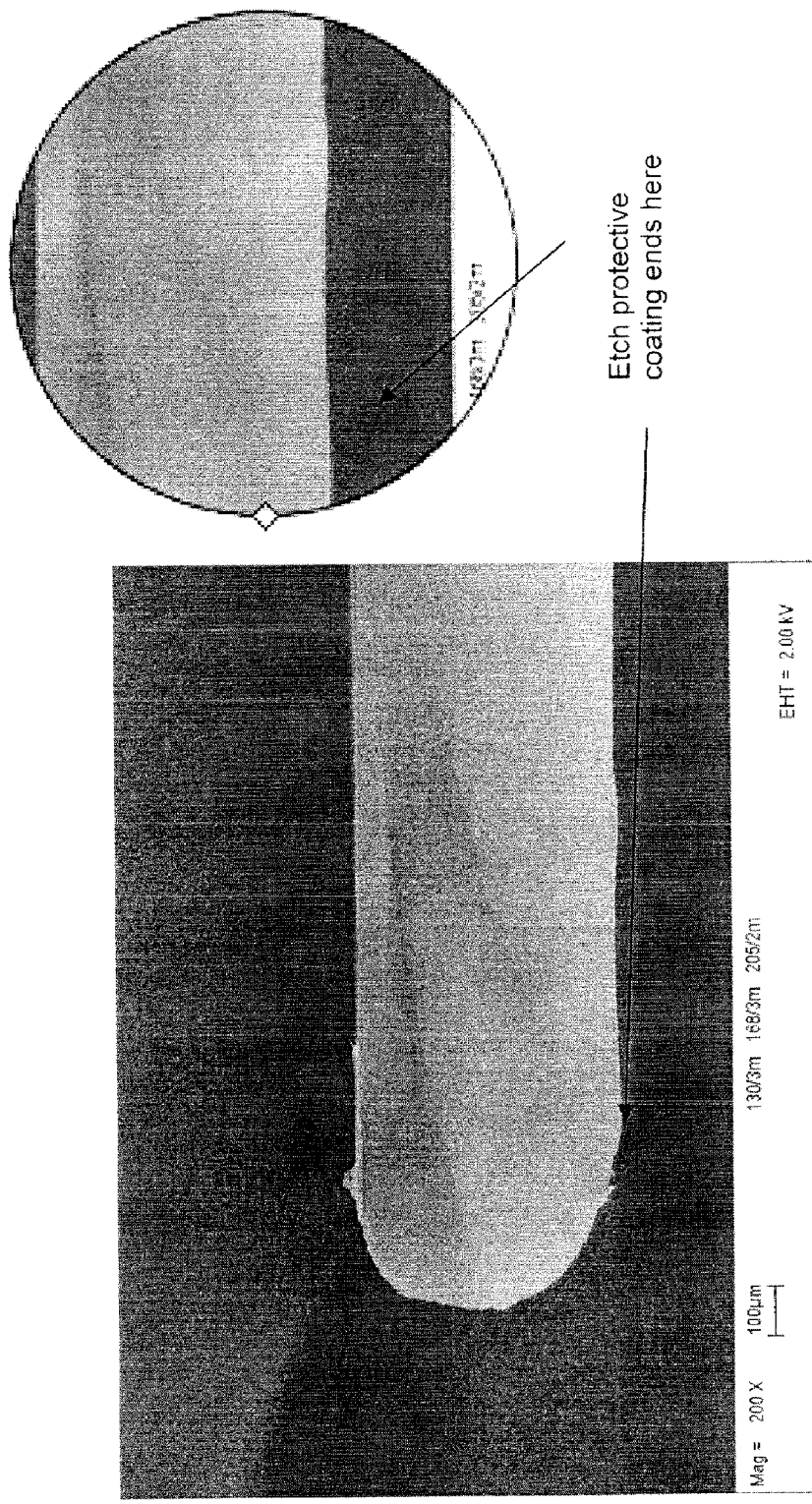
FIG. 8a is an SEM illustrating the edge of a silicon wafer after being coated with a protective material while using the inventive baffle.
FIG. 8b is an enlarged view of FIG. 8a, showing the edge of the protective coating on the wafer.

FIG. 8a shows the etch protective material wrapping around and covering the edge of the wafer and continuing to the back of the wafer. FIG. 8b further illustrates that the edge of the etch protective coating is well from the edge on the back side of the wafer.

Figure 9:
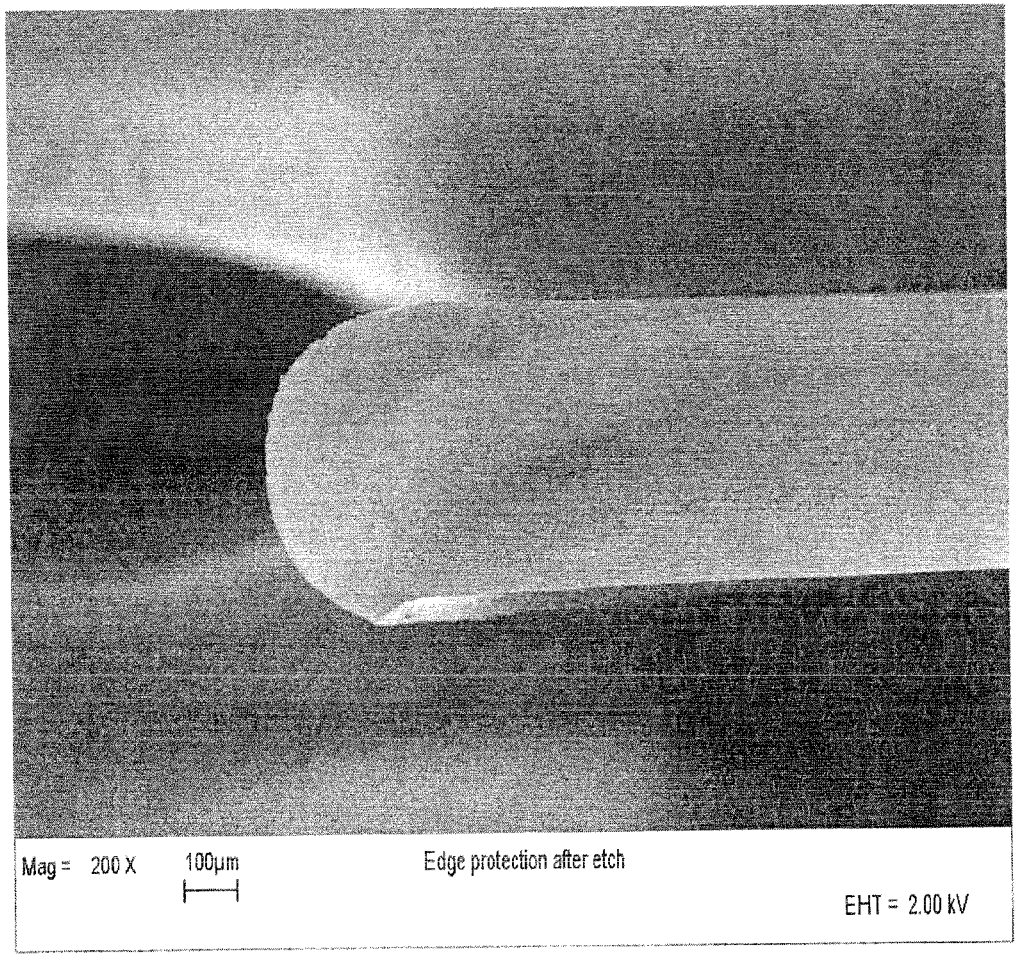
FIG. 9 is an SEM showing the edge of the wafer of FIG. 8a after it was subjected to a wet etching process.

The wafer with protective coating in place was then subjected to a wet chemical etching process using potassium hydroxide. FIG. 9 depicts the wafer after chemical etching, and the edge of the wafer is intact.

Example 3

Use of Inventive Baffle With Backside Dispense

Figure 10:
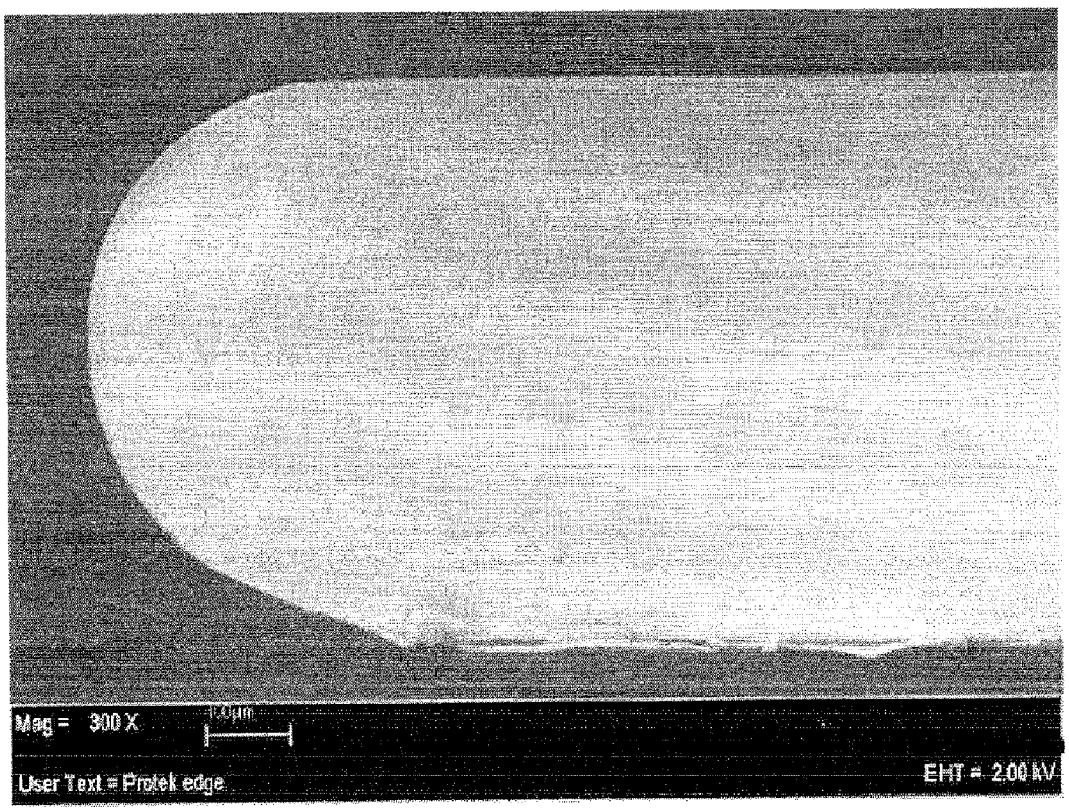
FIG. 10 is an SEM illustrating the back of a wafer after it was coated with a protective material.

The process of Example 2 was repeated except that a backside dispense was added to the spin bowl to create a larger area of protection against wet chemical etching on the wafer. The wafer was coated with a protective material as described in Example 2. With the backside dispense being utilized, the protective material was coated on the back of the wafer from the edge to about 5 mm from the wafer edge. FIG. 10 shows the back of the silicon wafer after having been coated in this example.

Figure 11:
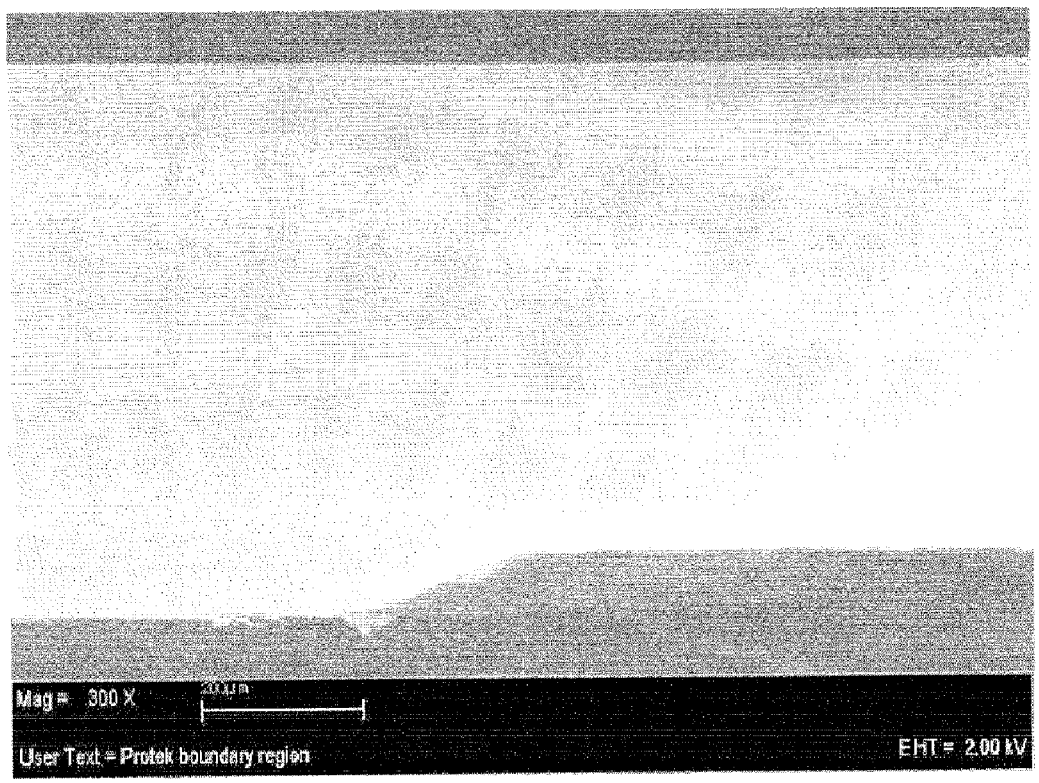
FIG. 11 is an SEM of the wafer of FIG. 10 after the wafer was subjected to a wet etching process.
Figure 12:
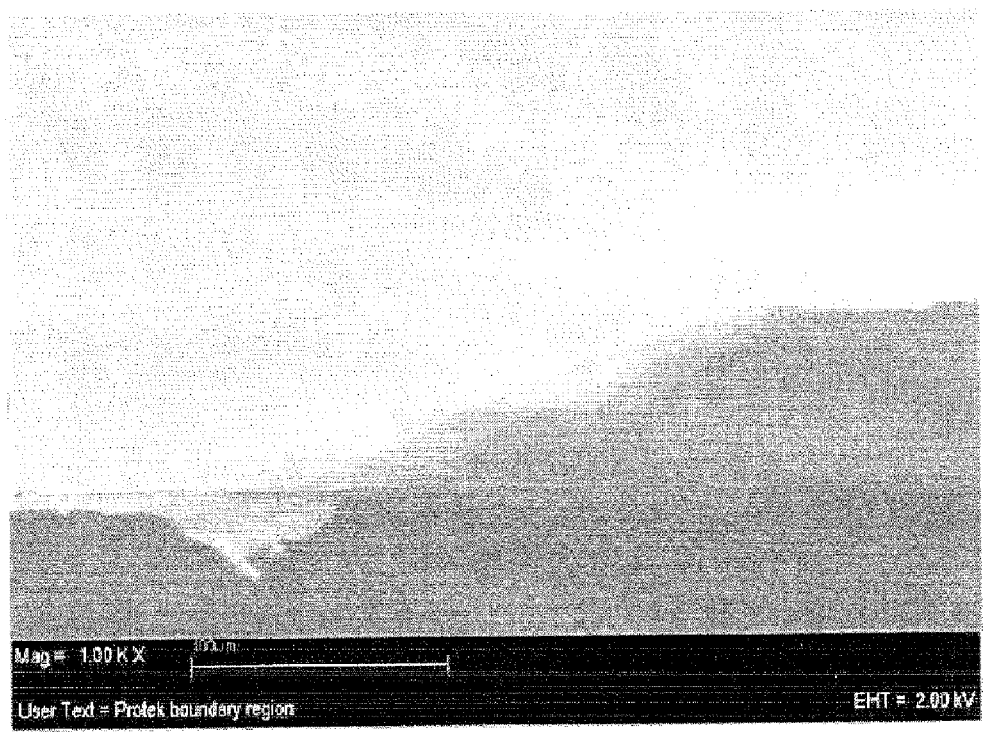
FIG. 12 is an enlarged view of the SEM of FIG. 11.
Figure 13:
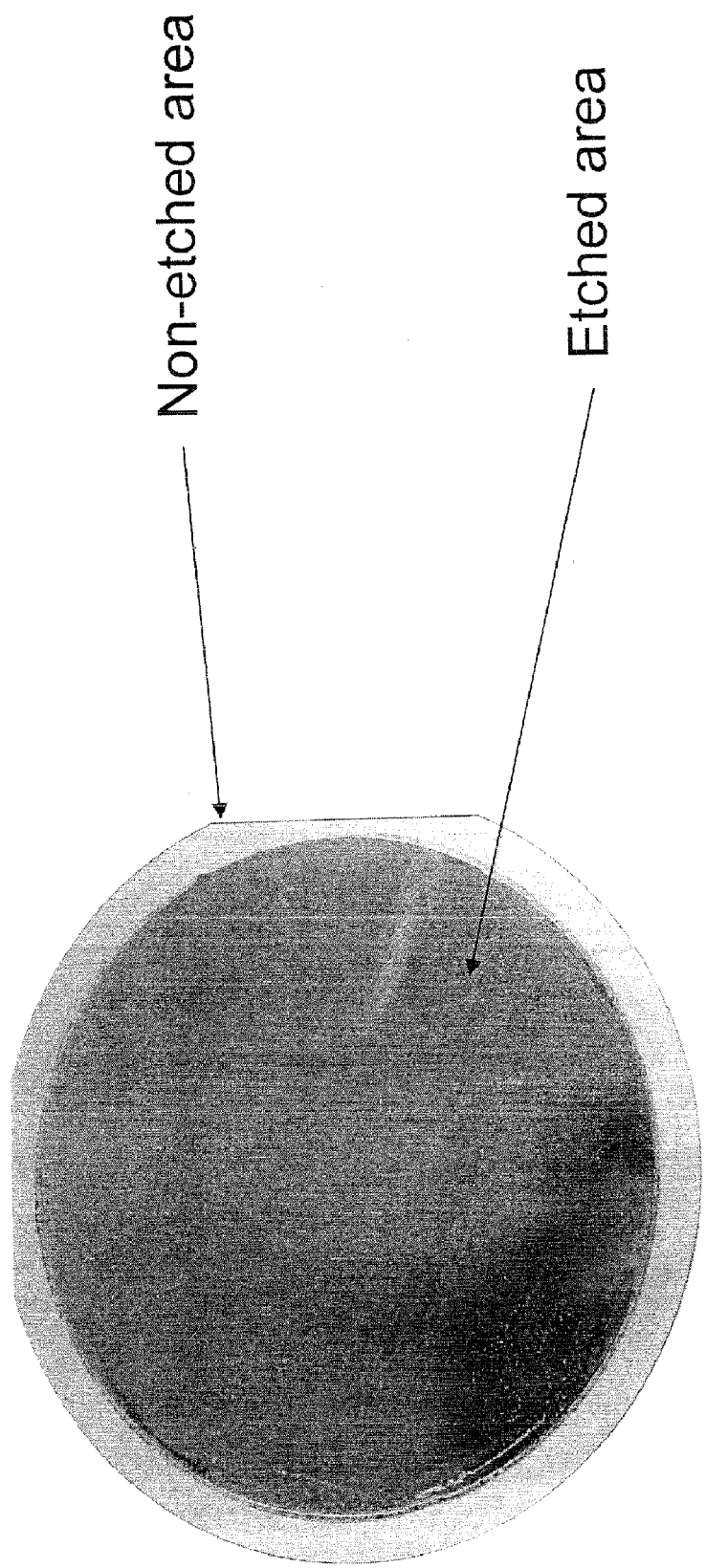
FIG. 13 is an SEM photograph illustrating the back of the wafer of FIGS. 9-12 after etching and after the protective coating has been removed.

The coated wafer was then subjected to a wet etch process using potassium hydroxide. FIGS. 11 and 12 illustrate the wafer after etching. The protective material lifted less than 1 mm from the edge of the coating. The protective material was then removed from the wafer, and the SEM photograph of FIG. 13 of the back of the wafer was taken. The entire outer ring of the wafer was protected from etching and remained intact.

We claim:

1. In a baffle for affecting the flow of a composition during application of the composition to a substrate having a maximum cross-sectional substrate dimension and an edge, the improvement comprising:
    an annular open-bottom base with upper and lower surfaces,
    said base including a continuous interior edge wall that intersects the upper and lower surfaces to define a base opening extending continuously between and through the upper surface and the lower surface so that the baffle is open at the lower surface,
    said base opening presenting an upright opening axis, with the opening having a cross-sectional dimension that varies along at least part of the axis,
    said edge wall being configured to direct the flow of the composition to the substrate edge,
    said edge wall including—
        a curved sidewall, with the opening having a cross-sectional sidewall dimension along the curved sidewall,
        said sidewall dimension varying axially, with at least one axial position presenting a sidewall dimension that is configured to be greater than the substrate dimension, and
        a lip coupled with said curved sidewall to be positioned below and adjacent to the sidewall,
    said lip projecting radially inwardly to define an innermost end, with the opening having a cross-sectional lip dimension at the innermost end that is configured to be less than the substrate dimension, such that the lip is dimensioned to underlie the substrate edge yet define the opening to be otherwise coextensive with the substrate, wherein the baffle is open below the substrate except for the lip when the substrate is placed within the baffle,
    said baffle comprising a synthetic resin composition.

2. The baffle of claim 1, wherein said synthetic resin composition is selected from the group consisting of polytetrafluoroethylene, polyethylene, polypropylene polyphenylene sulfide, acetals, polyether ether ketone, and mixture of the foregoing.

3. The baffle of claim 1, wherein said lip presents upper and lower surfaces, and said upper surface slopes towards said lower surface along a direction away from the curved sidewall.

4. The baffle of claim 3, wherein said slope is a slope of from about 1-15° from a horizontal position.

5. The baffle of claim 1, wherein said baffle comprises less than about 5% by weight metal, based upon the total weight of the baffle taken as 100% by weight.

6. The baffle of claim 1, wherein said base presents an axis of rotational symmetry.

7. The baffle of claim 6, wherein said edge wall presents a circular cross-sectional shape such that the cross-sectional substrate dimension, sidewall dimensions, and lip dimension are diameters.

8. The baffle of claim 1, wherein said base presents a geometric center that is aligned with the opening axis.

9. The baffle of claim 1, wherein said lip extends from the lower surface.

10. The baffle of claim 1, wherein said edge wall includes a vertical surface coupled with said curved sidewall to be positioned above and adjacent to the sidewall.

11. The baffle of claim 10, wherein:
    said curved sidewall has an apex, said apex being recessed a distance "l" defined as the distance from the apex to a line taken along the same plane as the vertical surface; and
    said lip extends away from the apex, said lip having a length "L" defined as the distance from the line taken along the vertical surface plane to said innermost end, wherein the length "L" is from about 1.5-4 times greater than the length "l".

12. In a baffle for affecting the flow of a composition during application of the composition to a substrate having a maximum cross-sectional substrate dimension and an edge, the improvement comprising:
    an annular open-bottom base with upper and lower surfaces,
    said base including a continuous interior edge wall that intersects the upper and lower surfaces to define a base opening extending continuously between and through the upper surface and the lower surface so that the baffle is open at the lower surface,
    said base opening presenting an upright opening axis, with the opening having a cross-sectional dimension that varies along at least part of the axis,
    said edge wall being configured to direct the flow of the composition to the substrate edge,
    said edge wall including—
        a curved sidewall, with the opening having a cross-sectional sidewall dimension along the curved sidewall,
        said sidewall dimension varying axially, with at least one axial position presenting a sidewall dimension that is configured to be greater than the substrate dimension, and
        a lip coupled with said curved sidewall to be positioned below and adjacent to the sidewall,
    said lip projecting radially inwardly to define an innermost end, with the opening having a cross-sectional lip dimension at the innermost end that is configured to be less than the substrate dimension, such that the lip is dimensioned to underlie the substrate edge yet define the opening to be otherwise coextensive with the substrate, wherein the baffle is open below the substrate except for the lip when the substrate is placed within the baffle,
    said baffle comprising less than about 5% by weight metal, based upon the total weight of the baffle taken as 100% by weight.

13. The baffle of claim 12, wherein said baffle comprises about 0% by weight metal, based upon the total weight of the baffle taken as 100% by weight.

14. The baffle of claim 12, wherein said lip presents upper and lower surfaces, and said upper surface slopes towards said lower surface along a direction away from the curved sidewall.

15. The baffle of claim 14, wherein said slope is a slope of from about 1-15° from a horizontal position.

16. The baffle of claim 12, wherein said edge wall includes a vertical surface coupled with said curved sidewall to be positioned above and adjacent to the sidewall.

17. The baffle of claim 16, wherein:
said curved sidewall has an apex, said apex being recessed a distance "l" defined as the distance from the apex to a line taken along the same plane as the vertical surface; and
said lip extends away from the apex, said lip having a length "L" defined as the distance from the line taken along the vertical surface plane to said innermost end, wherein the length "L" is from about 1.5-4 times greater than the length "l."

18. In a baffle for affecting the flow of a composition during application of the composition to a substrate having a maximum cross-sectional substrate dimension and an edge, the improvement comprising:
an annular open-bottom base with upper and lower surfaces,
said base including a continuous interior edge wall that intersects the upper and lower surfaces to define a base opening extending continuously between and through the upper surface and the lower surface so that the baffle is open at the lower surface,
said base opening presenting an upright opening axis, with the opening having a cross-sectional dimension that varies along at least part of the axis,
said edge wall being configured to direct the flow of the composition to the substrate edge,
said edge wall including—
a vertical surface;
a curved sidewall having an apex, said apex being recessed a distance "l" defined as the distance from the apex to a line taken along the same plane as the vertical surface,
said opening having a cross-sectional sidewall dimension along the curved sidewall,
said sidewall dimension varying axially, with at least one axial position presenting a sidewall dimension that is configured to be greater than the substrate dimension; and
a lip coupled with said curved sidewall to be positioned below and adjacent to the sidewall,
said lip extending away from the apex and presenting an innermost end, said lip having a length "L" defined as the distance from the line taken along the vertical surface plane to said innermost end, wherein the length "L" is from about 1.5-4 times greater than the length "l,"
said opening having a cross-sectional lip dimension at the innermost end that is configured to be less than the substrate dimension, such that the lip is dimensioned to underlie the substrate edge yet define the opening to be otherwise coextensive with the substrate, wherein the baffle is open below the substrate except for the lip when the substrate is placed within the baffle.

19. The baffle of claim 18, wherein said lip presents upper and lower surfaces, and said upper surface slopes towards said lower surface along a direction away from the curved sidewall.

20. The baffle of claim 19, wherein said slope is a slope of from about 1-15° from a horizontal position.

21. The combination of:
a substrate having a maximum cross-sectional dimension and an edge; and
an open-bottom baffle for affecting the flow of a composition during application of the composition to the substrate,
said baffle comprising an annular base with upper and lower surfaces,
said base including a continuous interior edge wall that intersects the upper and lower surfaces to define a base opening extending continuously between and through the upper surface and the lower surface so that the baffle is open at the lower surface,
said base opening presenting an upright opening axis, with the opening having a cross-sectional dimension that varies along at least part of the axis,
said edge wall being configured to direct the flow of the composition to the substrate edge,
said edge wall including—
a curved sidewall, with the opening having a cross-sectional sidewall dimension along the curved sidewall,
said sidewall dimension varying axially,
said substrate being positioned within the opening adjacent the curved sidewall but not in contact with the baffle, and
a lip coupled with the curved sidewall to be positioned below and adjacent to the sidewall,
said lip projecting radially inwardly to define an innermost end, with the opening having a cross-sectional lip dimension at the innermost end that is less than the substrate dimension, such that the lip is dimensioned to underlie the substrate edge yet define the opening to be otherwise coextensive with the substrate, wherein the baffle is open below the substrate except for the lip.

22. The combination of claim 21, said baffle comprising a synthetic resin composition.

23. The combination of claim 21, said substrate being a microelectronic substrate.

24. The combination of claim 23, said substrate being selected from the group consisting of silicon, silicon dioxide, silicon nitride, aluminum gallium arsenide, aluminum indium gallium phosphide, gallium nitride, gallium arsenide, indium gallium phosphide, indium gallium nitride, indium gallium arsenide, aluminum oxide, glass, quartz, polycarbonates, polyesters, acrylics, polyurethanes, papers, ceramics, and metal substrates.

* * * * *